(12) United States Patent  
Lee et al.

(10) Patent No.: US 7,683,348 B2
(45) Date of Patent: Mar. 23, 2010

(54) SENSOR FOR ION IMPLANTER

(75) Inventors: W Davis Lee, Boston, MA (US); Neil K Colvin, Merrimack, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 515 days.

(21) Appl. No.: 11/548,295

(22) Filed: Oct. 11, 2006

(65) Prior Publication Data
US 2008/0087846 A1   Apr. 17, 2008

(51) Int. Cl.
G21K 5/10 (2006.01)
(52) U.S. Cl. .................. 250/492.21; 250/396 R; 250/397; 250/491.1; 324/71.3
(58) Field of Classification Search ........... 250/492.21, 250/397, 396 R, 491.1; 324/71.3
See application file for complete search history.

(56) References Cited

U.S. PATENT DOCUMENTS

| 5,583,427 | A | * | 12/1996 | Teruya et al. | 324/71.3 |
| 5,744,812 | A | * | 4/1998 | Oh et al. | 250/492.21 |
| 5,998,798 | A | * | 12/1999 | Halling et al. | 250/492.21 |
| 6,528,805 | B2 | * | 3/2003 | Fang et al. | 250/492.21 |
| 6,677,598 | B1 | * | 1/2004 | Benveniste | 250/492.21 |
| 6,723,998 | B2 | * | 4/2004 | Bisson et al. | 250/397 |
| 6,852,984 | B2 | * | 2/2005 | Krueger | 250/397 |
| 6,872,953 | B1 | * | 3/2005 | Benveniste | 250/397 |
| 7,199,383 | B2 | * | 4/2007 | Chen et al. | 250/492.21 |
| 7,227,159 | B2 | * | 6/2007 | Shibata et al. | 250/492.21 |
| 7,361,914 | B2 | * | 4/2008 | Rathmell et al. | 250/492.21 |
| 7,385,207 | B2 | * | 6/2008 | Yoon | 250/492.21 |
| 7,385,208 | B2 | * | 6/2008 | Cheng et al. | 250/492.21 |
| 7,394,073 | B2 | * | 7/2008 | Cummings et al. | 250/397 |
| 7,435,977 | B2 | * | 10/2008 | Freer et al. | 250/492.21 |
| 7,518,130 | B2 | * | 4/2009 | Chen et al. | 250/492.21 |
| 2002/0121889 | A1 | * | 9/2002 | Larsen et al. | 324/71.3 |
| 2004/0149926 | A1 | * | 8/2004 | Purser et al. | 250/397 |
| 2004/0195528 | A1 | * | 10/2004 | Reece et al. | 250/492.21 |
| 2006/0006346 | A1 | * | 1/2006 | Rathmell et al. | 250/492.21 |
| 2006/0097195 | A1 | * | 5/2006 | Angel et al. | 250/492.21 |
| 2006/0219955 | A1 | * | 10/2006 | Ray | 250/492.21 |
| 2006/0284117 | A1 | * | 12/2006 | Vanderpot et al. | 250/492.21 |
| 2006/0289798 | A1 | * | 12/2006 | Cummings et al. | 250/492.21 |
| 2007/0075260 | A1 | * | 4/2007 | Park | 250/397 |
| 2007/0138412 | A1 | * | 6/2007 | Freer | 250/492.21 |
| 2008/0017811 | A1 | * | 1/2008 | Collart et al. | 250/492.21 |

* cited by examiner

Primary Examiner—David A Vanore
Assistant Examiner—Michael J Logie
(74) Attorney, Agent, or Firm—Tarolli, Sundheim, Covell & Tummino LLP

(57) ABSTRACT

A Faraday cup structure for use with a processing tool. The cup structure has a conductive strike plate coupled to a circuit for monitoring ions striking the strike plate to obtain an indication of the ion beam current. The electrically conductive strike plate is fronted by a mask for dividing an ion beam intercepting cross section into regions or segments. The mask including walls extending to the strike plate for impeding ions reaching the sensor and particles dislodged from the sensor from entering into the evacuated region of the processing tool.

20 Claims, 5 Drawing Sheets

SENSOR FOR ION IMPLANTER

FIELD OF THE INVENTION

The present invention relates to an improved sensor for use with an ion implanter that reduces production rate of material from the Faraday, thus lowering the deposition rate in the process chamber and thereby lowering the frequency of required maintenance.

BACKGROUND ART

Ion implanters can be used to treat silicon wafers by bombardment of the wafers with an ion beam. One use of such beam treatment is to selectively dope the wafers with impurities of a controlled concentration to yield a semiconductor material during fabrication of a integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, semiconductor wafers are implanted in the wafer processing device.

Batch processing ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with co-ordinated wafer support movements to selectively dope or treat the entire wafer surface.

Faraday cups are used to measure beam current. These cups are periodically inserted into an ion beam either upstream of the implantation chamber or at a region behind a workpiece support to monitor beam current. U.S. Pat. No. 6,992,309 to Petry et al. illustrates a dosimetry system having a Faraday cup that is mounted for movement along a controlled path. The disclosure of the '309 patent is incorporated herein by reference.

SUMMARY

A semiconductor processing tool has an evacuated region for treating a workpiece by directing an ion beam to strike a workpiece. One such tool includes an ion source and beam transfer structure for transferring ions in a beam from the ion source to a workpiece support. The workpiece support is located in an implantation chamber. The path of travel from the source to the implantation chamber is at a low pressure as is the implantation chamber.

A sensor includes an electrically conductive base and a mask electrically coupled to the conductive base that divides ion that make up an ion beam into regions or segments. The mask has walls extending from a front region of the sensor to the base. These walls impedes ions that reach the sensor from reentering the evacuated region of the processing tool.

Further features of the disclosure will become apparent to those skilled in the art to which the present invention relates from reading the following specification with reference to the accompanying drawings.

EXEMPLARY EMBODIMENT FOR PRACTICING THE INVENTION

Figure 1:
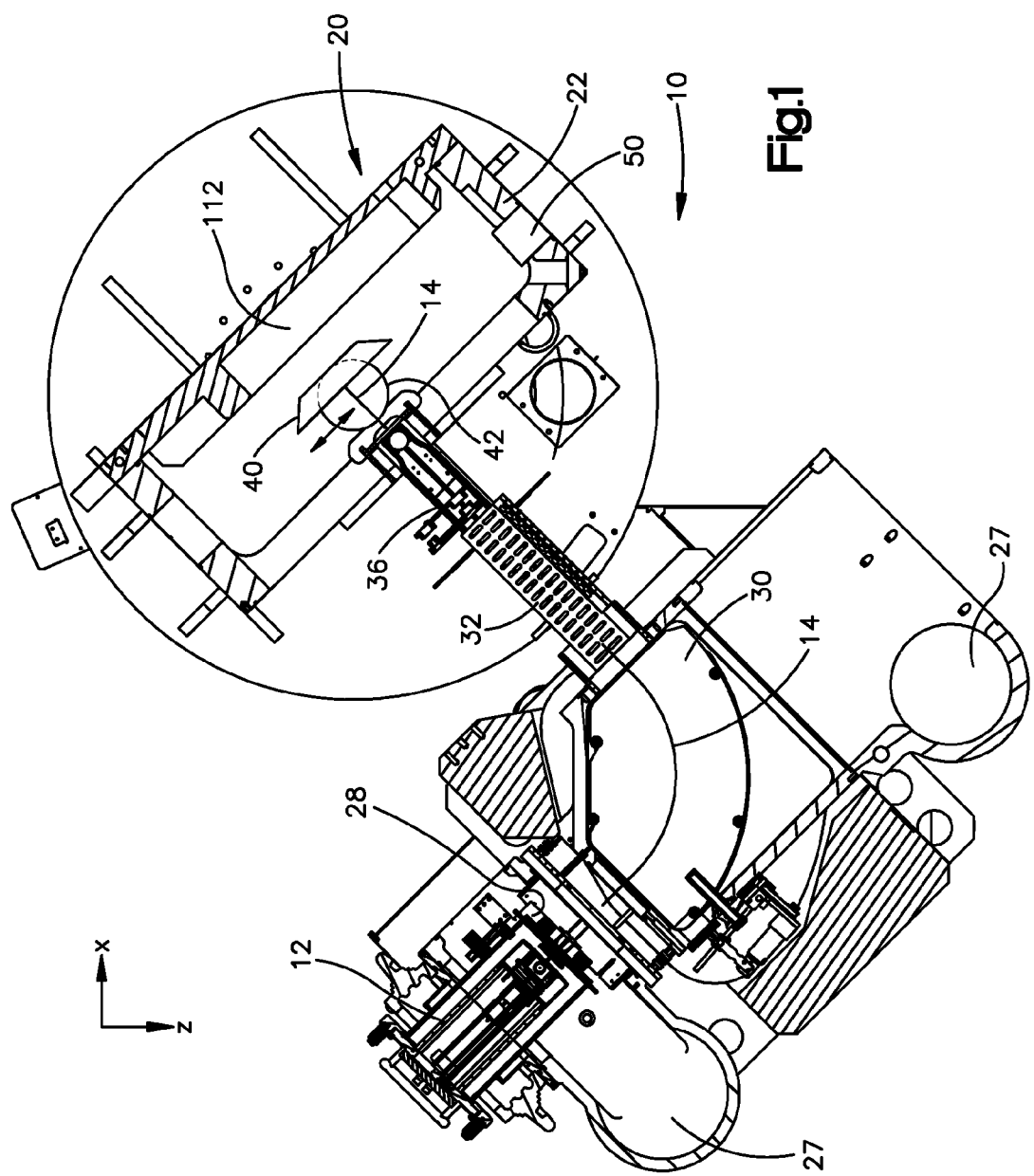
FIG. 1 is schematic top plan view of an ion implanter for ion beam treatment of a workpiece such as a silicon wafer mounted on a support.

Turning to the drawings, FIG. 1 is a schematic depiction of an ion beam implanter 10. The implanter includes an ion source 12 for creating ions that form an ion beam 14 which is shaped and selectively deflected to traverse a beam path to an end or implantation station 20. The implantation station includes a vacuum or implantation chamber 22 defining an interior region in which a workpiece such as a semiconductor wafer is positioned for implantation by ions that make up the ion beam 14.

Figure 8:
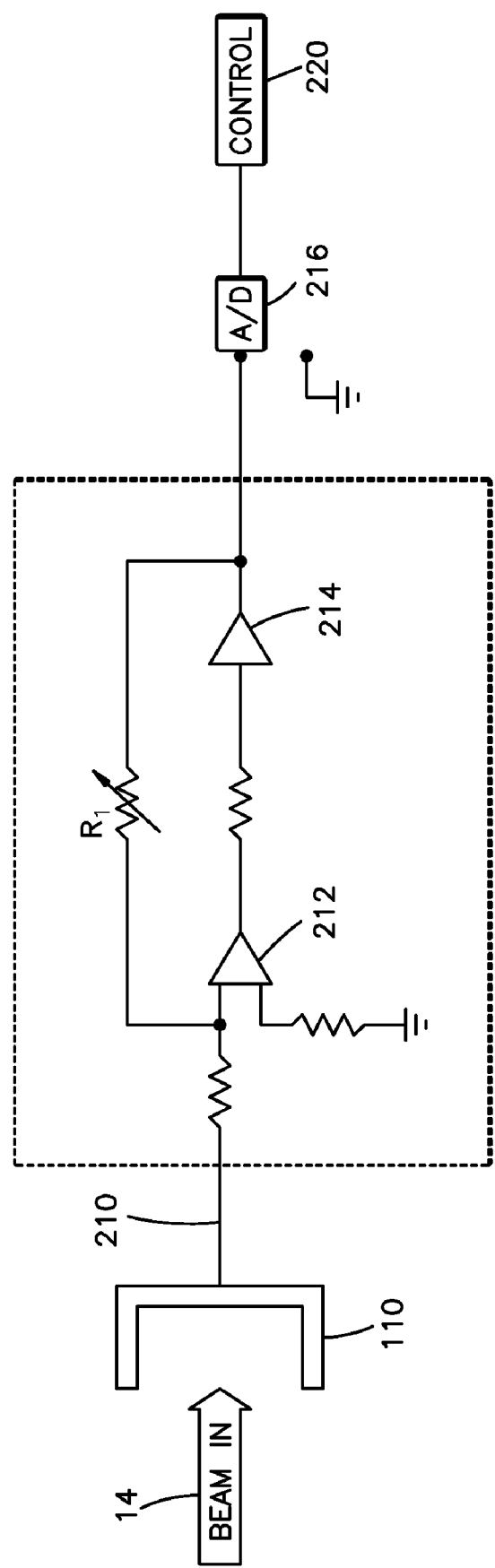
FIG. 8 is a schematic block diagram of a control system for use with the invention.

Control electronics (FIG. 8) are provided for monitoring and controlling the ion dose received by the workpiece in the implantation chamber. Operator input to the control electronics are performed via a user control console (not shown) located near the implantation station 20.

The ions in the ion beam 14 tend to diverge as the beam traverses a region between the source and the implantation chamber. To reduce this divergence, the region is maintained at low pressure by one or more vacuum pumps 27 in fluid communication with the ion beam path.

The ion source 12 includes a plasma chamber defining an interior region into which source materials are injected. The source materials may include an ionizable gas or vaporized source material. Ions generated within the plasma chamber are extracted from the chamber by ion beam extraction assembly 28, which includes a number of metallic electrodes for creating an ion accelerating electric field.

Positioned along the beam path 14 is an analyzing magnet 30 which bends the ion beam 14 and directs the ions through a beam neutralizer 32. The beam neutralizer injects electrons into the beam and impedes beam blow up thereby enhancing the ion transfer efficiency of the system. Downstream form the neutralizer 32, the beam 14 passes through a resolving aperture 36 which is an aperture plate which defines a minimum beam waist. The ion beam 14 that exits the resolving aperture is of an appropriate size and shape for the application.

A workpiece support 40 known as wafer clamp is seen position in relation to a port 42 in fluid communication with a pump (not shown). A wafer is electrostatically attracted to the support and rotates the wafer up into the beam and then moves the workpiece up and down and from side to side with respect to the ion beam 14. The sequence of movements is such that an entire implantation surface of the workpiece 24 is uniformly implanted with ions. A typical application treats a wafer to dope the wafer with controlled concentrations of dopant. Since the implantation chamber interior region is evacuated, workpieces must enter and exit the chamber through a load lock 50. In accordance with one embodiment, a robot that is positioned within the implantation chamber 22 moves wafer workpieces to and from the load lock. The robot moves the wafer from the load lock to the workpiece support by means of an arm which reaches into the load lock to capture a workpiece for movement within the evacuated region of the implantation chamber. Prior to implantation, the workpiece support structure rotates the workpiece to a vertical or near vertical position for implantation. If the workpiece 24 is vertical, that is, normal with respect to the ion beam 14, the implantation angle or angle of incidence between the ion beam and the normal to the workpiece surface is 0 degrees.

In a typical implantation operation, undoped workpieces (typically semiconductor wafers) are retrieved from one of a number of cassettes by a robot outside the chamber which move a workpiece which has been oriented to a proper orientation into the load lock. The load lock closes and is pumped down to a desired vacuum, and then opens into the implantation chamber 22. The robotic arm of the chamber robot grasps the workpiece 24, brings it within the implantation chamber 22 and places it on an electrostatic clamp or chuck of the workpiece support structure.

The electrostatic clamp is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion beam processing of the workpiece 24, the workpiece support structure returns the workpiece 24 to a horizontal orientation and the electrostatic clamp releases the workpiece. The chamber robot grasps the workpiece after such ion beam treatment and moves it from the support back into the load lock. From the load lock, a robotic arm of a robot outside the chamber 22 moves the implanted workpiece 24 back to one of a storage cassette and most typically to the cassette from which it was initially withdrawn.

Faraday Cup

Figure 2:
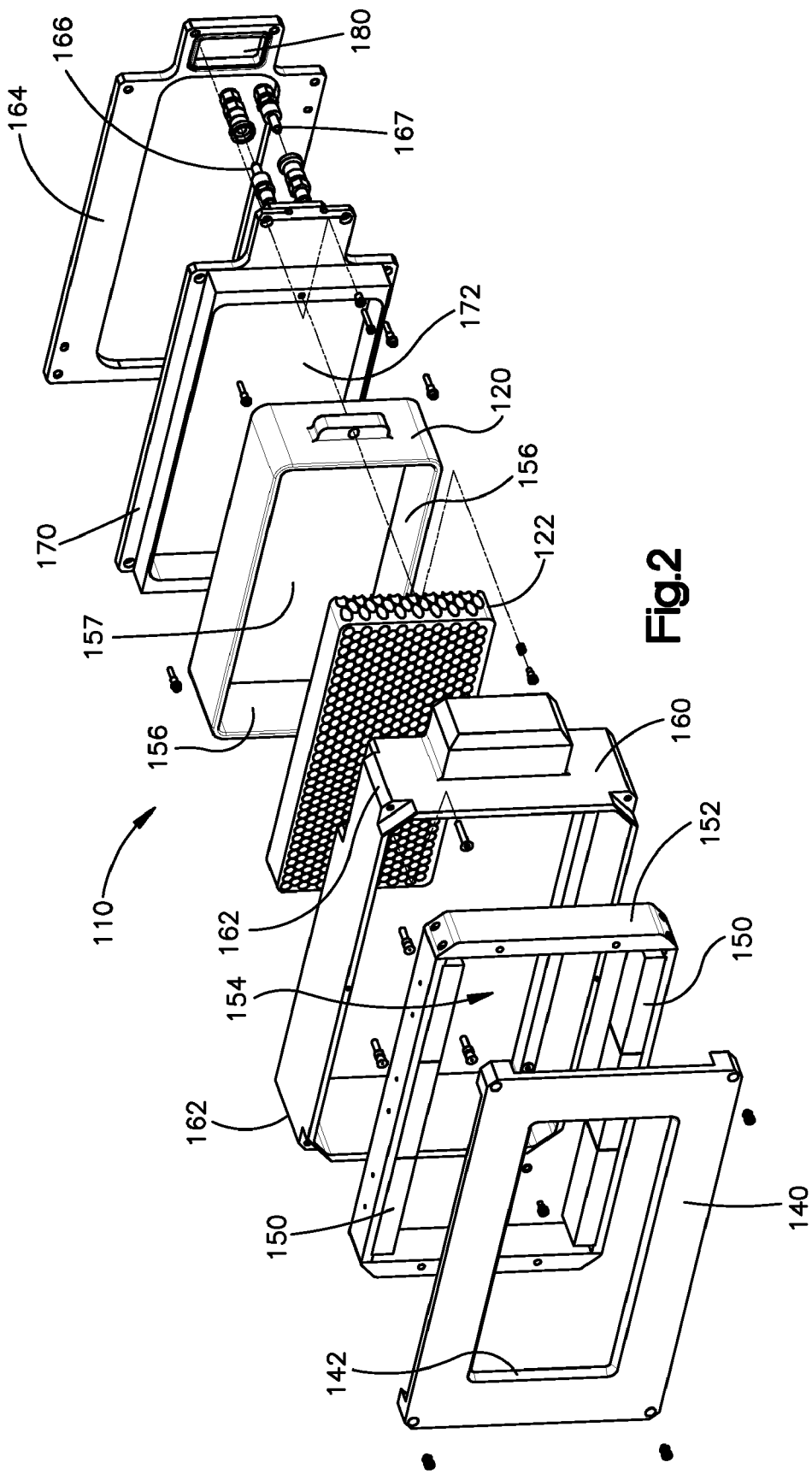
FIG. 2 is an exploded perspective view of a sensor for sensing beam current.
Figure 3:
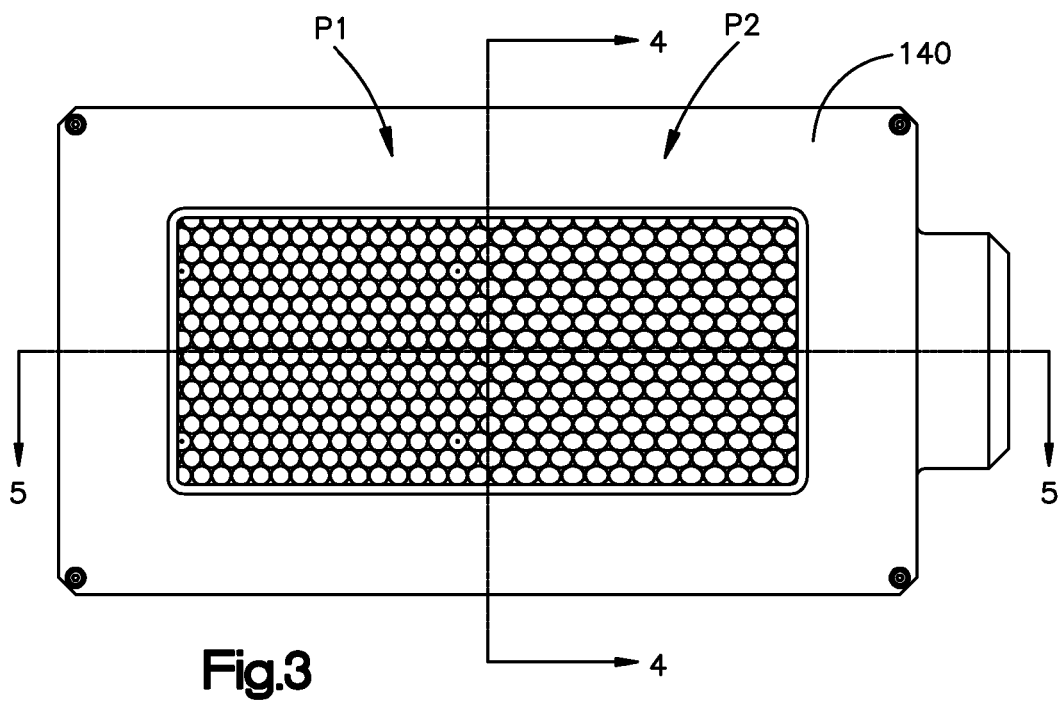
FIG. 3 is a front plan view of the sensor shown in FIG. 2.
Figure 4:
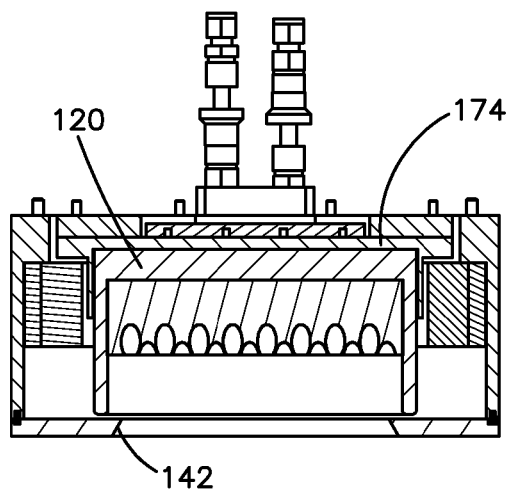
FIG. 4 is a view as seen from the plane defined by the line 4-4 in FIG. 3.

A Faraday cup sensor 110 is mounted to an interior wall of the ion implantation chamber 22 at a region 112 behind the workpiece support 40. The sensor 110 is shown in the exploded perspective view shown in FIG. 2 to include an electrically conductive base 120 and a mask structure 122 in electrical engagement with the conductive base 120.

The mask 122 divides the incident ion beam, sending it into multiple pathways 130a, 130b, 130c etc (FIG. 5) leading to the base 120 that are bounded by intermediate walls 132, essentially making many very deep Faraday cups in close proximity. The walls extend from a front edge or entrance 134 of the mask to the base 120. The walls 132 impede ions in the beam from bouncing off the base and reentering the evacuated region of the processing tool. The walls 132 also serve to impede material dislodged from the base from being ejected from the Faraday cup sensor 110 into the ion implantation chamber 22.

The Faraday cup sensor 110 includes a front or entrance plate 140 that provides an interior border 142 surrounding the beam which allows ions passing through the implantation region of the chamber to impact the mask/base combination. A number of magnets 150 are mounted between the mask 122 and the entrance plate 140. These magnets 150 are mounted to a rectangular shaped magnet support 152. The magnets prevent electrons created as ions impact the base or mask from backstreaming into the implantation chamber 22. The magnetic field that is created by the magnets is generally uniform in a gap 154 between the magnets and deflects electrons to the side. An electron in this region is deflected to the side walls of the Faraday cup 156.

The base 120 supports the mask 122 in position relative the ion beam and includes side walls 156 and a rear wall 157 that define a cup that bounds the mask and fit inside the magnet support 152 and a housing 160 for the sensor 110. The housing defines bosses 162 at its corners that have threaded openings to accommodate corresponding threaded connectors which pass through openings in the entrance plate 140 on a surface facing away from the walls of the chamber 22. Similar threaded openings in these bosses 162 facing toward the walls of the chamber mate with connectors passing through a mounting plate 164 that attaches the sensor to the inner walls of the chamber.

Water is routed into the region of the sensor 110 by inlet and outlet conduits 166, 167 which direct coolant (typically water) into and out of a heat sink 170 that defines passageways for routing the coolant through a heat absorbing portion 172 of the heat sink 170 that abuts a back wall 174 of the base 120. As seen most clearly in FIG. 5, fluid connectors 176 attach to the heat sink 170 and extends through an opening 180 in the mounting plate 164. Quick disconnect couplings are easily connected and disconnected at a point outside the chamber at atmospheric pressure.

Some ion implant recipes call for angled implants. To meet these requirements the process chamber 22 rotates about a vertical axis, changing the angle of the workpiece relative to the ion beam. To maintain the advantages of the mask, even at high implant angles, a second region of the Faraday structure has been made at an angle.

Figure 5:
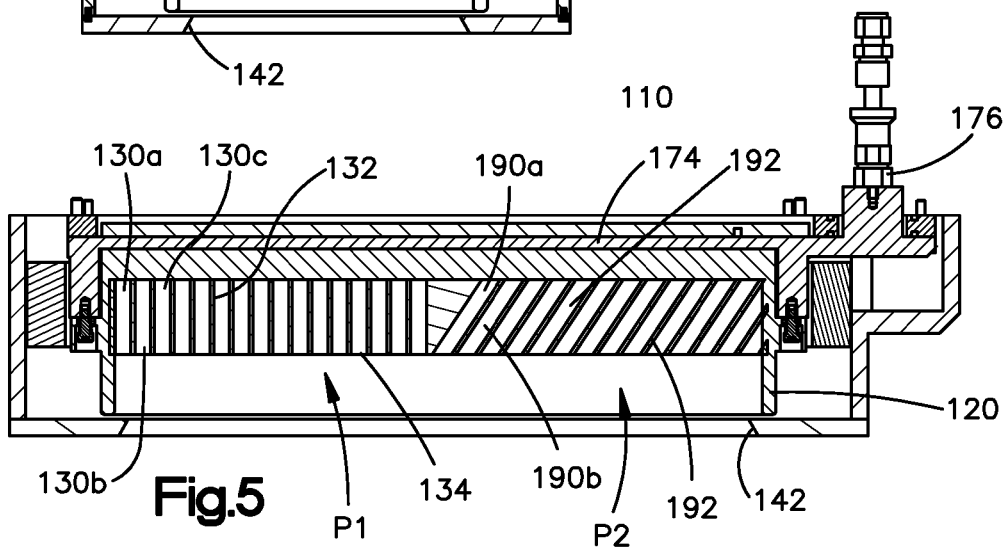
FIG. 5 is a view as seen from the plane defined by the line 5-5 in FIG. 3.
Figure 6:
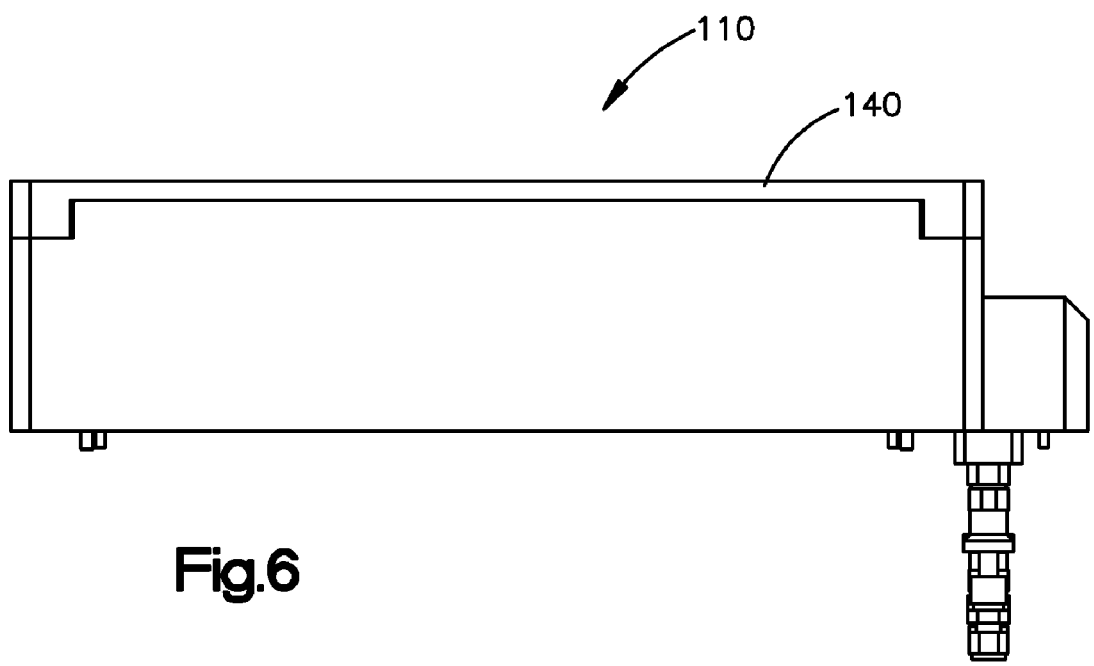
FIG. 6 is a side elevation view of the sensor of FIG. 2.
Figure 7:
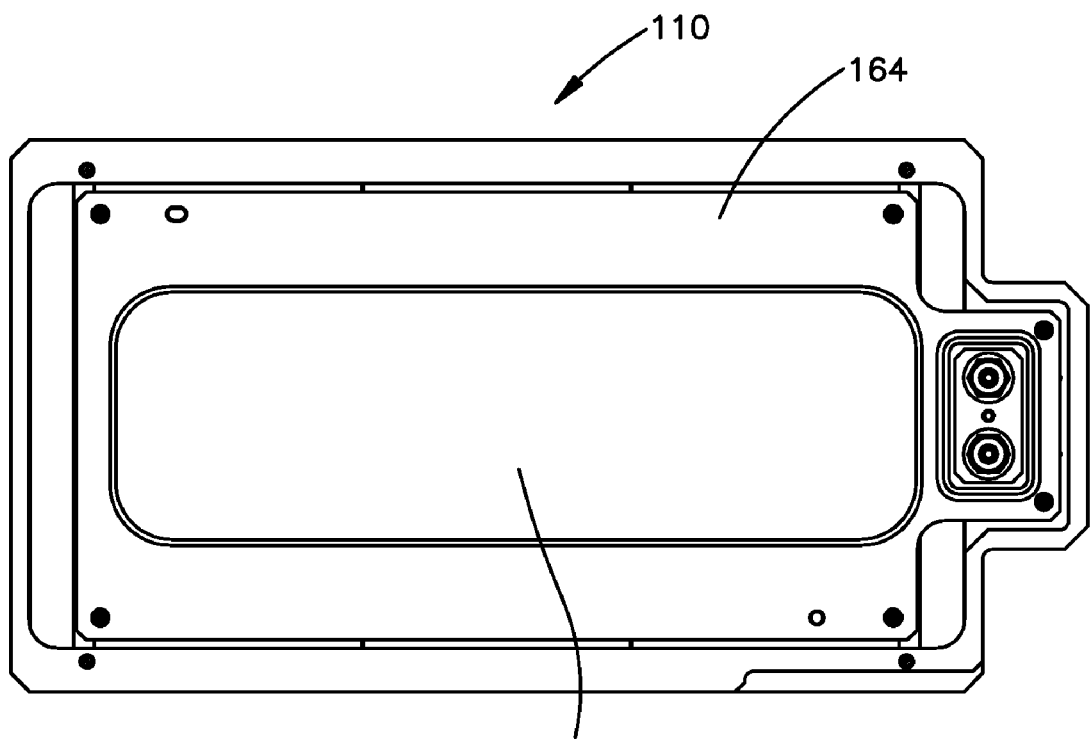
FIG. 7 is a rear plan view of the sensor of FIG. 2.

As seen most clearly in FIG. 5, the mask has two side by side portions P1, P2. These are shown to depict two alternate mask configurations. In an alternate arrangement all passageways are of the same configuration. There is nothing in the operation of the sensor, however, that would preclude use of the alternate designs in a single mask. On the left (as seen in FIG. 5) the mask defines passageways 130a, 130b etc that provide an unimpeded path for ions to the base. On the right, the passageways 190a, 190b etc are bounded by walls 192 that are angled with respect to the front surface 134 (approx 30-35 degrees) of the mask. This angle was chosen as it provides the best results for the given geometry over the widest range of high implant angles.

Turning to FIG. 1, the entire implant chamber 22 rotates, along with the support 40 about a y axis approximately co-incident with the position of the workpiece. This allows the angle of incidence between the beam 14 and the wafer workpiece to be adjusted. As this rotation occurs the sensor 110 revolves to a different position. As seen in FIG. 5, when the incident angle between beam 14 and workpiece is at right angles, the beam (with the support 40 out of the way) strikes the sensor 110 at a position on the left of the sensor portion P1. When the chamber is rotated to its extreme counterclockwise position, the beam strikes the portion P2 along the right of that portion. Although two different portions are depicted it is appreciated that more than two different angles could be used and that for example a continuum of angles across a width of the mask could be used.

In the exemplary embodiment both the mask and the base are fabricated from graphite. The two are held in electrical contact and the current due to ion bombardment is routed to ground through a conductor 210 attached to the sensor 110. A variable gain current sensor having two amplifiers 212, 214 monitors current through this conductor 210 and converts the current to a voltage. An output from the current sensor is coupled to an A/D converter 216 and indicates to the controller 220 the magnitude of the current which is used in adjusting ion beam parameters to control a dose of ion implantation when the support positions a wafer workpiece in the beam for implantation treatment.

An optimization between minimizing frontal surface area and maximizing the depth to diameter aspect ratio of the passageways yields the most efficient structure. Constraints such as physical room in the tool, manufacturability, material choice and material properties, play a crucial roll in this optimization. Circular passageways that have generally cylindrical walls are preferred due to the ease of manufacturing. Hexagonal configurations may be more efficient in gathering ions but are harder to construct. Square configurations may be easier to construct but less efficient. A goal is to maximize ion capture as well as limiting backscattering without undue encroachment in the region of the chamber 22. The specific geometry, material choice and application will determine the optimal dimensions of the mask structure.

It is understood that although an exemplary embodiment of the invention has been described with a degree of particularity, alterations and modifications from that embodiment are included which fall within the spirit or scope of the appended claims.

We claim:

1. For use with a semiconductor processing tool having an evacuated region for treating a workpiece by directing an ion beam to strike a workpiece, apparatus comprising:
   a source, beam transfer structure and a workpiece support defining a path of travel for ions in an ion beam that impinge on one or more workpieces at an implantation station,
   a sensor comprising an electrically conductive base having a generally planar strike plate and an electrically conductive mask in electrical contact with the base that comprises a mask body having an array of elongated throughpassages that extend from a front surface of the mask body, through the mask body to a rear surface of the mask body in contact with the generally planar strike plate of the base for dividing an ion intercepting cross section of said beam into regions, and
   a housing that supports the sensor while holding the rear surface of the mask body in engagement with the generally planar strike plate of the conductive base,
   said mask throughpassages including walls extending through the mask body to allow ions to pass through the mask body and strike said conductive base while impeding ions reaching the sensor from rebounding into the evacuated region of the processing tool.

2. The apparatus of claim 1 wherein the sensor is fixed with respect a moving workpiece support in an implantation chamber.

3. The apparatus of claim 1 additionally comprising a controller coupled to the sensor for monitoring electrical charge of charged ions impacting the sensor.

4. The apparatus of claim 1 wherein the throughpassages are generally cylindrical.

5. The apparatus of claim 4 wherein an orientation angles of the cylindrical throughpassages differ across the sensor.

6. The apparatus of claim 5 wherein the cylindrical throughpassages form two or more different angles with a front surface of said mask.

7. The apparatus of claim 1 wherein the implantation station comprises a chamber mounted for rotation and wherein the sensor is mounted to the chamber so that as the chamber is rotated, an angle of incidence between the ion beam and the mask changes.

8. The apparatus of claim 1 wherein the base and the mask are constructed from graphite.

9. The apparatus of claim 1 wherein the mask has a front surface whose ratio to a circumscribed area of said mask is approximately 14%.

10. The apparatus of claim 1 wherein the base forms a cup that supports the mask in position within the sensor.

11. The apparatus of claim 1 additionally comprising a number of magnets that border the path of travel before ions strike the mask or base to inhibit backstreaming of electrons from the region of the base into the implantation station.

12. In a semiconductor processing assembly, a method for reducing and controlling contaminates within the processing assembly comprising:
   mounting a workpiece for processing in an evacuated region and causing a beam of ions to controllably impact the workpiece by accelerating the ions from a source to said workpiece through an evacuated region that defines a beam travel path;
   positioning an electrically conductive sensing surface in the beam travel path to gather ion beam current data, and
   mounting an electrically conductive beam segmenting multichannel mask body which is machined from a single piece of electrically conductive material upstream in the travel path from the sensing surface and in electrical communication with the electrically conductive sensing surface so that bounding walls of throughpassages that extend from a front to rear surface of said mask body segment allow the ions to reach the sensing surface and inhibit backstreaming of material away from the sensing surface after collision of ions with the sensing surface.

13. The method of claim 12 wherein the mask body is machined from a single piece of graphite to form multiple throughpassages.

14. The method of claim 12 wherein the sensing surface is mounted within an implantation chamber which is rotated about an axis to modify an angle of impact between the ion beam and the workpiece.

15. The method of claim 14 wherein the sensing surface and mask body are mounted to the implantation chamber so that rotation of the chamber changes an angle the ions of the beam contact the mask.

16. The method of claim 15 wherein the mask body is constructed from a graphite material having two different regions of passageways machined into the graphite material and wherein rotation of the chamber causes the ion beam to enter different passageway regions.

17. An ion beam current sensor comprising:
   a) an electrically conductive strike plate coupled to a circuit for monitoring ions striking the strike plate and obtaining an indication of the ion beam current striking the conductive strike plate; and
   b) a mask abutting the conductive strike plate having two or more regions wherein generally cylindrical passageways of one region have center axes that are angled with respect to axes of generally cylindrical passageways of a different one of said regions for segmenting the ions directed to said strike plate into channels for impeding backscattering of ions striking the conductive strike plate.

18. The apparatus of claim 17 wherein the cylinders of one portion have axes that form an angle of between 30 and 35 degrees of the axes of the cylinders of a second portion.

19. The current sensor of claim 17 wherein the mask is conductive and has a thickness through which extend elongated channels or passageways to allow ions of an ion beam reaching a region of the mask to pass through the mask and contact the strike plate.

20. For use with a semiconductor processing tool having an evacuated region for treating a workpiece by directing an ion beam to strike a workpiece, apparatus comprising:

a source, beam transfer structure and a workpiece support defining a path of travel for ions in an ion beam that impinge on one or more workpieces at an implantation station, and a sensor comprising:
a) an electrically conductive base; and
b) an electrically conductive mask for dividing an ion intercepting cross section of said beam into regions, said mask including a mask body having throughpassages bound by walls and constructed from a single sensor subassembly extending to and in electrical contact with the electrically conductive base for impeding ions reaching the sensor from rebounding into the evacuated region of the processing tool.

* * * * *